(12) United States Patent
Chen et al.

(10) Patent No.: US 8,968,589 B2
(45) Date of Patent: *Mar. 3, 2015

(54) FILLED-SKUTTERUDITE COMPOSITE MATERIAL AND METHOD OF PREPARING THE SAME

(75) Inventors: Lidong Chen, Shanghai (CN); Xihong Chen, Shanghai (CN); Lin He, Horseheads, NY (US); Xiangyang Huang, Shanghai (CN); Zhen Xiong, Shanghai (CN); Wenqing Zhang, Shanghai (CN)

(73) Assignee: Shanghai Institute of Ceramics, Chinese Academy of Sciences, Shanghai (CN)

( * ) Notice: Subject to any disclaimer, the term of this patent is extended or adjusted under 35 U.S.C. 154(b) by 193 days.

This patent is subject to a terminal disclaimer.

(21) Appl. No.: 13/497,833

(22) PCT Filed: Sep. 23, 2010

(86) PCT No.: PCT/US2010/049906
§ 371 (c)(1),
(2), (4) Date: Jun. 28, 2012

(87) PCT Pub. No.: WO2011/038055
PCT Pub. Date: Mar. 31, 2011

(65) Prior Publication Data
US 2013/0043439 A1 Feb. 21, 2013

(30) Foreign Application Priority Data
Sep. 28, 2009 (CN) .......................... 2009 1 0196619

(51) Int. Cl.
*C01G 51/00* (2006.01)
*H01L 35/18* (2006.01)
(Continued)

(52) U.S. Cl.
CPC .............. *C01G 51/006* (2013.01); *H01L 35/20* (2013.01); *B82Y 30/00* (2013.01); *C01P 2002/52* (2013.01);
(Continued)

(58) Field of Classification Search
CPC ................................ H01L 35/18; H01L 35/20
USPC ............... 252/62.3 T; 136/240; 977/779, 784
See application file for complete search history.

(56) References Cited

U.S. PATENT DOCUMENTS 5,994,639 A * 11/1999 Johnson et al. ............ 136/236.1
6,207,888 B1 3/2001 Nolas

FOREIGN PATENT DOCUMENTS

WO 2009/077767 A1 6/2009

OTHER PUBLICATIONS

Xiong et al, "High thermoelectric performance of Yb0.26Co4Sb12/yGaSb nanocomposites originating from scattering electrons of low energy", Acta Materials, 58, Apr. 13, 2010, pp. 3995-4002.*
(Continued)

*Primary Examiner* — Carol M Koslow
(74) *Attorney, Agent, or Firm* — Harness, Dickey & Pierce, PLC

(57) ABSTRACT

A composite material comprises a filled skutterudite matrix of formula (I) $I_yCo_4Sb_{12}$ in which (I) represents at least one of Yb, Eu, Ce, La, Nd, Ba and Sr, $0.05 \le y < 1$; and GaSb particles within the filled skutterudite matrix, wherein the composite material comprises 0.05-5 mol % GaSb particles. Compared with conventional materials, the composite material exhibits a substantially increased Seebeck coefficient, a slightly decreased overall thermal conductivity, and a substantially increased thermoelectric performance index across the whole temperature zone from the low temperature end to the high temperature end, as well as a greatly enhanced thermoelectric efficiency.

17 Claims, 6 Drawing Sheets

(51) Int. Cl.
*H01L 35/20* (2006.01)
*B82Y 30/00* (2011.01)

(52) U.S. Cl.
CPC ......... *C01P 2002/72* (2013.01); *C01P 2004/64* (2013.01); *C01P 2004/80* (2013.01); *C01P 2006/40* (2013.01); *H01L 35/18* (2013.01); *Y10S 977/779* (2013.01); *Y10S 977/784* (2013.01)
USPC ........ 252/62.3 T; 136/240; 977/779; 977/784

(56) References Cited

OTHER PUBLICATIONS

International Preliminary Report on Patentability dated Apr. 3, 2012.
International Search Report dated Jan. 12, 2011.
G.S.Nolas et al; "high figure of merit in partially filled ytterbium skutterudite materials" Appl. Phys. Lett., V 77, No. 12, 2000, pg. 1855-1857.

* cited by examiner

FILLED-SKUTTERUDITE COMPOSITE MATERIAL AND METHOD OF PREPARING THE SAME

CROSS-REFERENCE TO RELATED APPLICATIONS

This application claims priority to Chinese Patent Application number 200919196619.3, filed Sep. 28, 2009, titled "Filled Skutterudite Based Composite Material and Process For Preparing Same."

TECHNICAL FIELD

The invention relates to a thermoelectric material, particularly to a filled skutterudite-based composite material having superior thermoelectric property and a process for preparing the same.

BACKGROUND

Thermoelectric conversion technology is one that takes advantage of the Seebeck effect of a material to accomplish direct conversion of thermal energy to electric energy or the Peltier effect of a material for refrigeration. Characterized by no operating components, high reliability, long life, environmental friendliness, etc., the technology may be used in a wide variety of fields such as power generation using residual heat, aerospace power supply, medical refrigeration, home appliances for refrigeration and the like. Thermoelectric conversion efficiency is mainly determined by the dimensionless performance index ZT of the material ($ZT=S^2\sigma T/\kappa$, wherein S stands for Seebeck coefficient, $\sigma$ for electric conductivity, $\kappa$ for thermal conductivity, and T for absolute temperature). A higher ZT value of the material means a higher thermoelectric conversion efficiency.

When a p-type thermoelectric material and an n-type thermoelectric material are combined to form a thermoelectric device, the thermoelectric conversion efficiency of the device is closely related to the temperature difference and the average Z value between the low temperature end and the high temperature end. The maximum thermoelectric conversion efficiency may be figured out as follows:

$$\eta_{max} = \frac{T_h - T_l}{T_h} \frac{(1+Z\overline{T})^{\frac{1}{2}} - 1}{(1+Z\overline{T})^{\frac{1}{2}} + \frac{T_l}{T_h}}$$

wherein $\overline{T}=(T_h+T_l)/2$ is the average temperature, and $Z=S^2\sigma/\kappa$ (represents the average Z value of the p-type semiconductor and the n-type semiconductor in the whole temperature range $T_l$-$T_h$ from the low temperature end to the high temperature end. Therefore, with respect to the enhancement of the efficiency, materials having higher ZT values across the whole temperature range are desirable.

Owing to its superior electric transmission property and relatively low thermal conductivity, filled skutterudites are considered to be an ideal thermoelectric conversion material for use at medium to high temperatures (500-800K). The crystal lattice thermal conductivity of such a material may be decreased by small-radius atoms filled in an icosahedron cage structure where the atoms can form weak bonds with the surrounding atoms of phosphorus family so that the disturbance effect is incurred and phonons are scattered effectively. Thus, the type and the amount of the filled atoms are typically modified to optimize the thermoelectric property of a material. However, the decrease of the crystal lattice thermal conductivity is generally accompanied by substantial increase of carrier concentration, leading to degradation of the Seebeck coefficient of the material. Therefore, it is difficult to improve the thermoelectric property of filled skutterudited further solely by changing the type and the amount of the filled atoms.

A second phase is commonly introduced as a scattering center of phonons into a thermoelectric matrix, so that a maximum decrease of the crystal lattice thermal conductivity of the material can be achieved. Generally, the second phase is a second phase of nanoparticles. Since phonons are featured by a relatively broad frequency distribution, the second-phase particles of different size may scatter different phonons of corresponding waves effectively. It is generally believed that particles of 50-300 nm in particle size have no substantial impact on the transmission characteristics of carriers. However, when the second-phase particles are fined to 10-20 nm in size, the second nanophase may scatter the carriers to such an extent that electrons of low energy are filtered off. Electrons of low energy contribute relatively low to the Seebeck coefficient of a material, they can lead to significant increase of the Seebeck coefficient after they are scattered fiercely. On the other hand, the total thermal conductivity has no change or has slight decrease. As a result, the ZT value of the material is increased. The filtration of low-energy electrons by nanoparticles is shown schematically in FIG. 1.

In order to achieve an ideal effect in scattering phonons and electrons, second-phase particles can be introduced into a filled skutterudite matrix material homogeneously. A second nanophase is generally introduced by one of the following processes.

(1) Mechanical mixing. Ball milling was used by Katsuyama et al. to prepare $CoSb_3/FeSb_2$ and $CoSb_3/NiSb$ composite materials, which had better properties than $CoSb_3$ composite material (J. Appl. Phys., 88, 3484, 2000. J. Appl. Phys., 93, 2758, 2003). Although this process has the advantage of being simple, the second nanophase doped therein is generally characterized by a rather large size, and homogeneous distribution is difficult to be achieved in nanoscale. Thus, the second nanophase has limited contribution to the scattering of phonons.

(2) Oxidizing a component of the thermoelectric matrix. According to Kusakabe et al., a thin oxide layer was obtained on the particle surface of $CoSb_3$ powder by oxidation to lower the thermal conductivity of the matrix and increase the Seebeck coefficient (U.S. Pat. No. 5,929,351, Jul. 27, 1999). However, it is quite difficult in practice to adjust process parameters such as temperature, oxygen partial pressure and the like to control the oxidation of the thermoelectric matrix precisely. In other words, it is by no means easy to choose process conditions suitable for forming an oxide layer on the granular surface of the matrix without sacrificing its electric properties.

(3) Forming a second nanophase, for example Sb, via in-situ precipitation (Appl. Phys. Lett., 92, 202114, 2008). Although this process can promote homogeneous dispersion of nanoscale Sb in the matrix, Sb tends to evaporate in use due to its low melting point (~631° C.) and high vapor pressure (0.01 kPa). Furthermore, as a metal phase, Sb brings to the composite material a carrier concentration much higher than is suitable for giving the material optimal thermoelectric property, so that the electric transmission property of the composite material is degraded. Despite that the in-situ process can promote homogeneous dispersion of nanoparticles in the matrix, it is difficult currently to find a suitable component as well as a suitable process to form in-situ a stable second nanophase.

According to Johnson et al. (U.S. Pat. No. 5,994,639), the thermoelectric property of a skutterudite material having a meta-stable structure of super crystal lattice may be improved. However, this typical lamellar structure can be generally obtained in a two-dimensionally structured material (e.g., thin film) rather than three-dimensionally one.

In view of the foregoing, there is a need in the art for a nanoscale filled skutterudite composite material having a stable second phase of particles to impart to it superior thermoelectric property and a process for preparing the same.

SUMMARY

A first embodiment relates to a nanoscale filled skutterudite composite material having a stable second phase of particles to impart it superior thermoelectric property.

A further embodiment relates to a process for preparing a nanoscale filled skutterudite composite material having a stable second phase of particles to impart it superior thermoelectric property.

A further embodiment relates to a process for increasing the ZT value of a thermoelectric material.

A still further embodiment relates to a process for preparing a material comprising the filled skutterudite matrix.

A discloses composite material, comprises a filled skutterudite matrix of formula (I)

$$I_yCo_4Sb_{12} \tag{I}$$

wherein I represents at least one of Yb, Eu, Ce, La, Nd, Ba and Sr, $0.05 \leq y < 1$; and GaSb particles within said filled skutterudite matrix, wherein the composite material comprises 0.05-5 mol % GaSb particles.

In one embodiment, y has a value of $0.1 \leq y \leq 0.5$.

In an embodiment, the GaSb particles are GaSb nanoparticles.

In an embodiment, the GaSb particles are GaSb nanoparticles with an average grain size of 2 nm-50 nm.

In an embodiment, the GaSb particles are GaSb nanoparticles with an average grain size of 5 nm-30 nm.

In an embodiment, the GaSb nanoparticles are precipitated in-situ in the filled skutterudite matrix to form the second phase of GaSb nanoparticles.

In an embodiment, the GaSb particles are distributed intragranularly in the crystalline granules of the filled skutterudite matrix, or intergranularly on the crystalline boundaries of the filled skutterudite matrix, or both.

In an embodiment, I is Yb.

In an embodiment, I is Ce, Ba or a combination thereof.

In an embodiment, the composite material comprises 0.1-2.0 mol % GaSb particles.

In an embodiment, the composite material comprises 1.0-2.0 mol % GaSb particles.

A process for preparing the composite material comprises providing a molten mixture of I, Co, Sb and Ga, wherein I represents at least one of Yb, Eu, Ce, La, Nd, Ba and Sr, quenching the molten mixture to form a solid bulk material, annealing the solid bulk material to form an annealed solid bulk material, forming the annealed solid bulk material into powder, and consolidating the powder to form said composite material.

In an embodiment, the molten mixture is molten and mixed at a melting temperature of 1000-1200° C.

In an embodiment, a quenching medium selected from air, water, salt water, oil or liquid nitrogen is used during quenching.

In an embodiment, melt spinning technique is used during quenching at a cooling rate of 50° C.-10⁶° C./s.

In an embodiment, the annealing is carried out at an annealing temperature of 400-850° C.

In an embodiment, the annealed solid bulk material is ground to powder.

In an embodiment, the powder is sintered by pressure sintering to form the composite material.

In an embodiment, the powder is sintered by pressure sintering or spark plasma sintering to form the composite material.

Also disclosed is a process for increasing the ZT value of a thermoelectric material which comprises a filled skutterudite matrix of formula (I)

$$I_yCo_4Sb_{12} \tag{I}$$

in which I represents at least one of Yb, Eu, Ce, La, Nd, Ba and Sr, and $0.05 \leq y < 1$, wherein the process comprises forming GaSb particles in the filled skutterudite matrix to give a composite material of the skutterudite matrix and the GaSb particles which have a content of 0.05-5 mol %.

In an embodiment, the composite material comprises 0.1-2.0 mol % GaSb particles.

In an embodiment, the composite material comprises 1.0-2.0 mol % GaSb particles.

In an embodiment, the ratio of the filled atoms I is $0.1 \leq y \leq 0.5$.

Also disclosed is provided a process for preparing a material comprising a filled skutterudite matrix of formula (I)

$$I_yCo_4Sb_{12} \tag{I}$$

in which I represents at least one of Yb, Eu, Ce, La, Nd, Ba and Sr, and $0.05 \leq y < 1$, wherein the process comprises forming GaSb particles in the filled skutterudite matrix to give a composite material of the skutterudite matrix and the GaSb particles which have a content of 0.05-5 mol %.

In an embodiment, the composite material comprises 0.1-2.0 mol % GaSb particles.

In an embodiment, the composite material comprises 1.0-2.0 mol % GaSb particles.

In an embodiment, the ratio of the filled atoms I is $0.1 \leq y \leq 0.5$.

DETAILED DESCRIPTION

Figure 1:
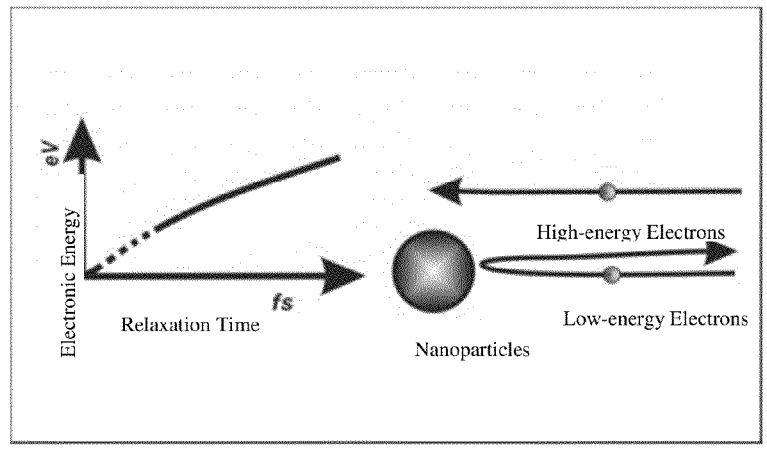
FIG. 1 shows schematically the filtration of low-energy electrons by nanoparticles.
Figure 2:
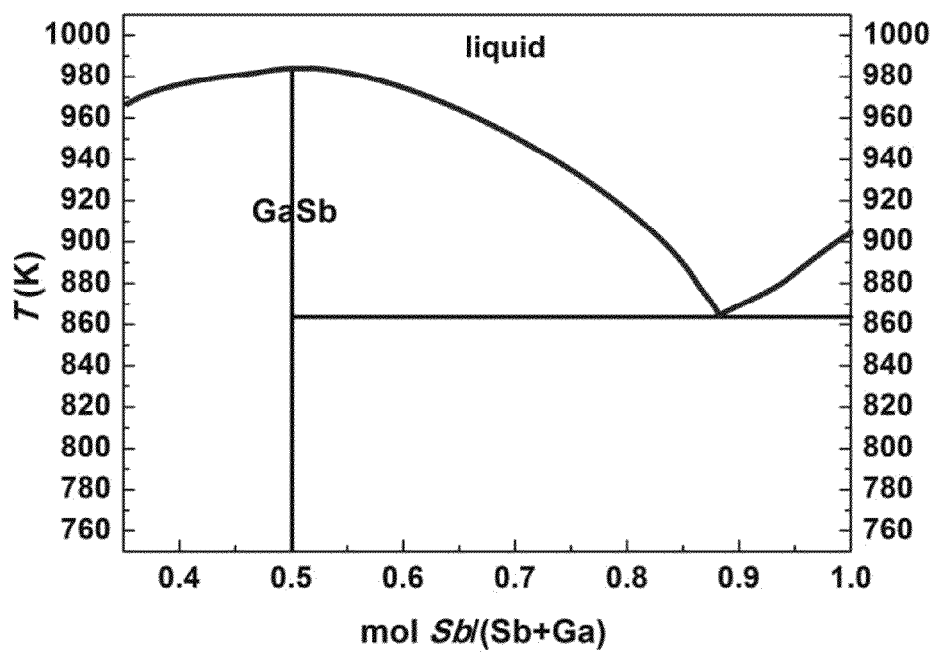
FIG. 2 shows the phase map of Ga—Sb.
Figure 3:
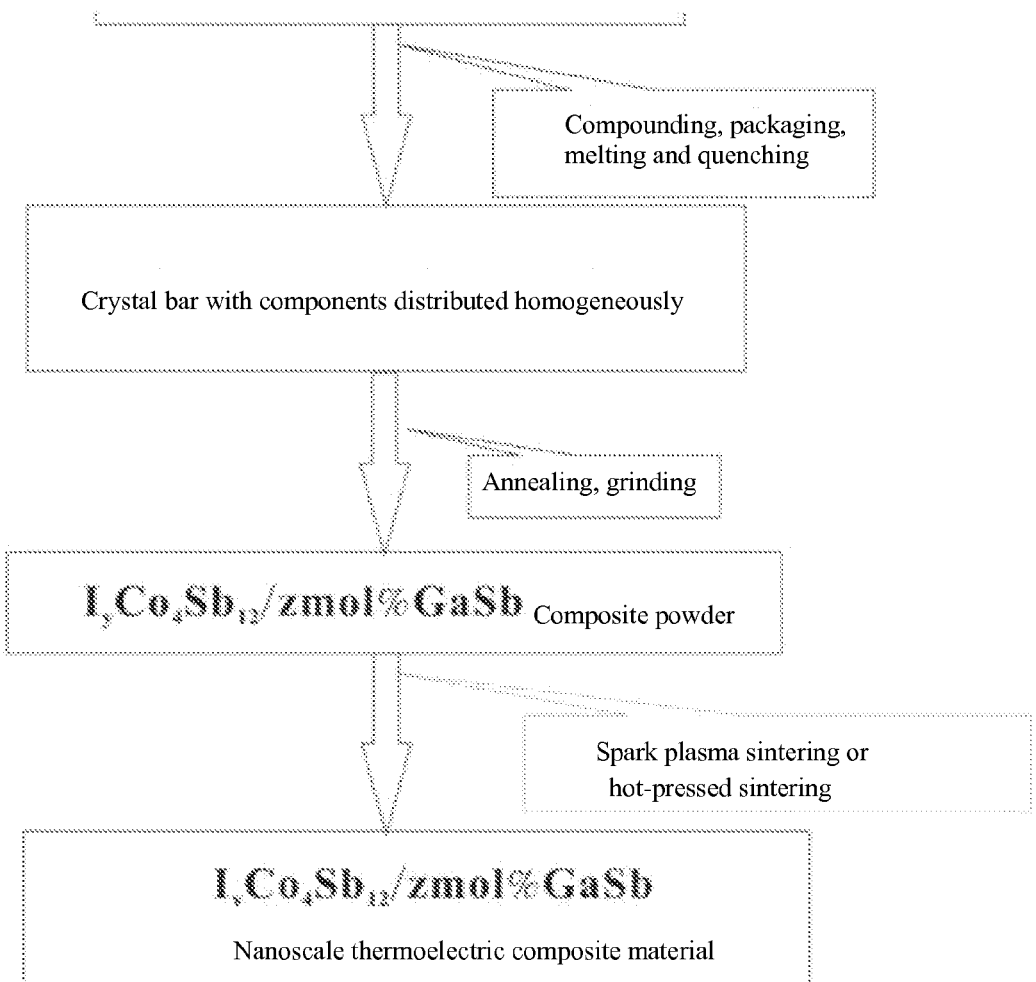
FIG. 3 shows the process flow chart of preparing a thermoelectric composite material of filled skutterudite based nanoscale GaSb.
Figure 4:
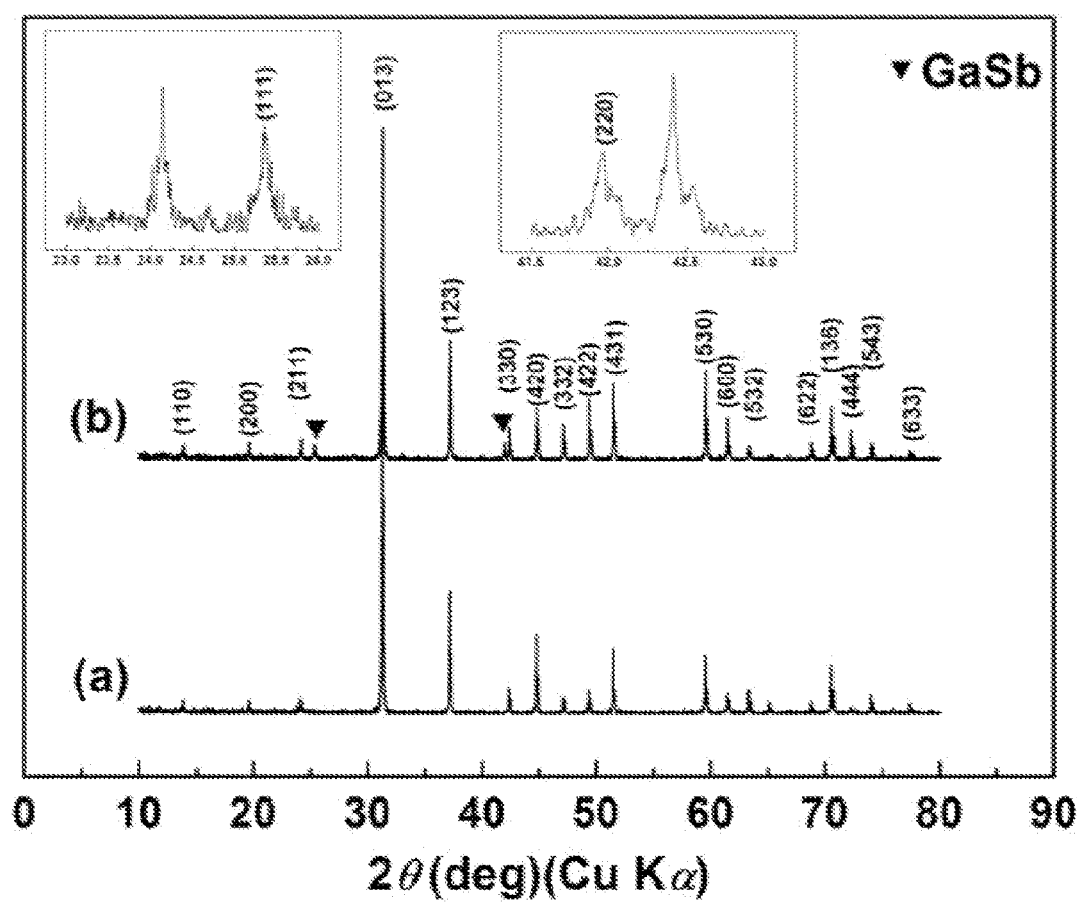
FIG. 4 shows the XRD pattern of $Yb_{0.26}CO_4Sb_{12}$ powder (a) and $Yb_{0.26}Co_4Sb_{12}/1.2$ mol % GaSb composite powder (b) prepared according to Example 1, wherein diffraction peaks (111) and (220) of GaSb can be observed.
Figure 5:
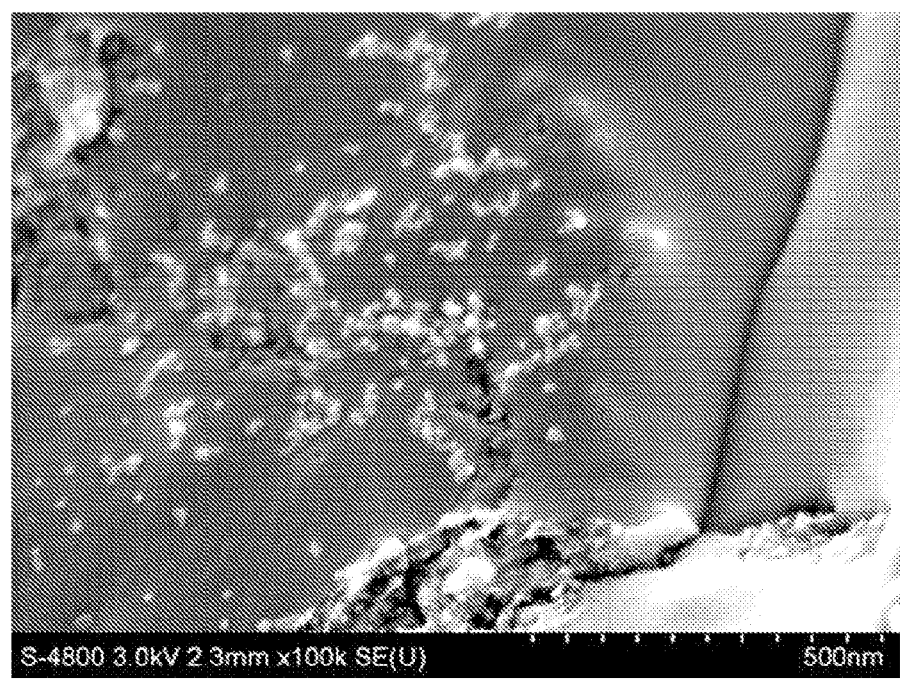
FIG. 5 shows the FESEM (field emission scanning electronic micrograph) image of the cross section of $Yb_{0.26}Co_4Sb_{12}/1.2$ mol % GaSb material prepared according to Example 1, wherein GaSb particles of 10-20 nm in particle size are dispersed in the matrix.
Figure 6:
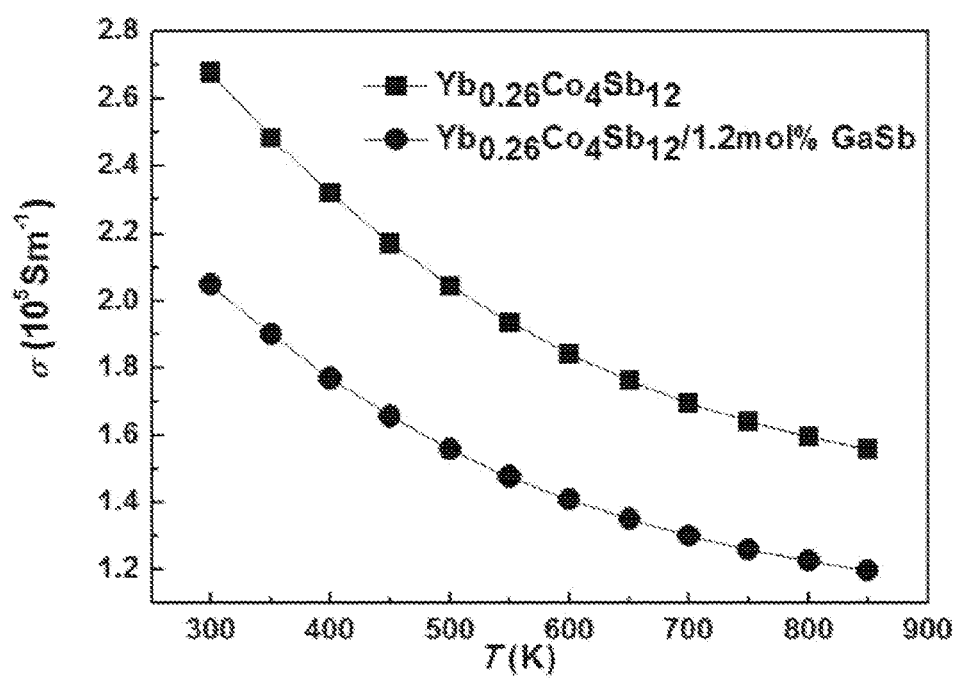
FIG. 6 shows the electric conductivity of $Yb_{0.26}Co_4Sb_{12}/1.2$ mol % GaSb thermoelectric composite material prepared according to Example 1 as a function of temperature, wherein the electric conductivity, represented by σ in the figure, is decreased to some extent due to the scattering of low-energy electrons by GaSb particles.
Figure 7:
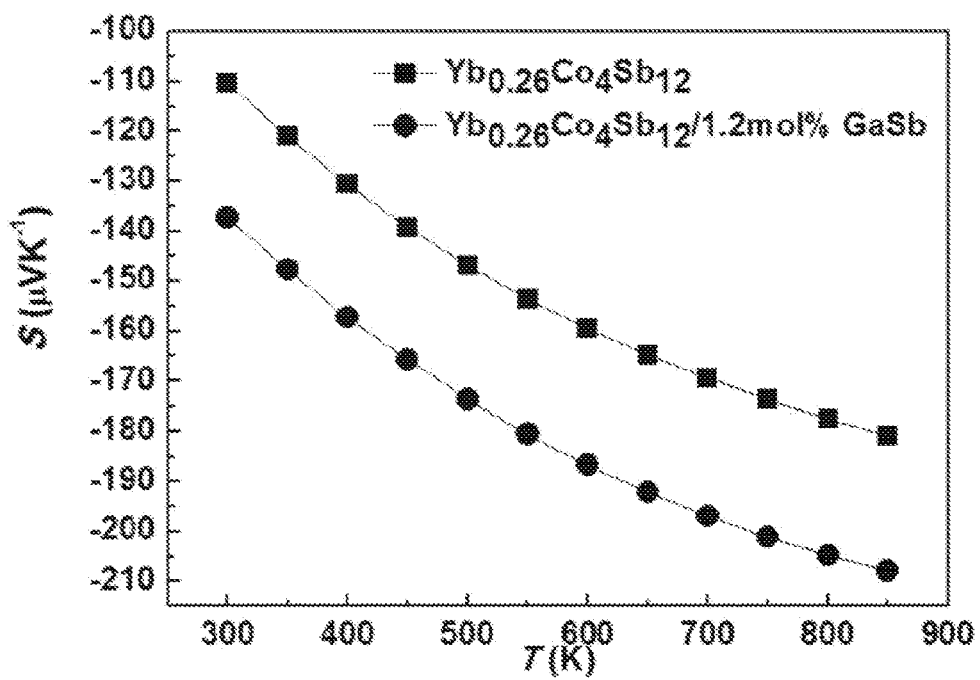
FIG. 7 shows the Seebeck coefficient of $Yb_{0.26}Co_4Sb_{12}/1.2$ mol % GaSb thermoelectric composite material prepared according to Example 1 as a function of temperature, wherein the Seebeck coefficient, represented by S in the figure, is increased due to the effective filtration of low-energy electrons by GaSb particles within the matrix so that the state density of the electrons is increased.
Figure 8:
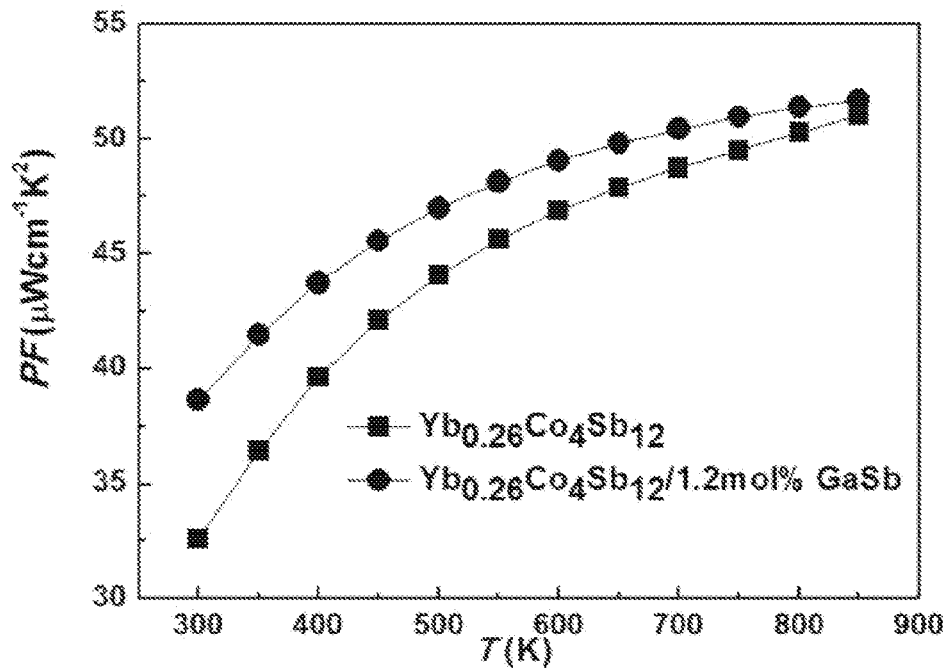
FIG. 8 shows the power factor of $Yb_{0.26}Co_4Sb_{12}/1.2$ mol % GaSb thermoelectric composite material prepared according to Example 1 as a function of temperature, wherein the power factor of the composite material ($S^2\sigma$), represented by PF in the figure, is increased in the whole temperature zone due to the relatively large increase of Seebeck coefficient.
Figure 9:
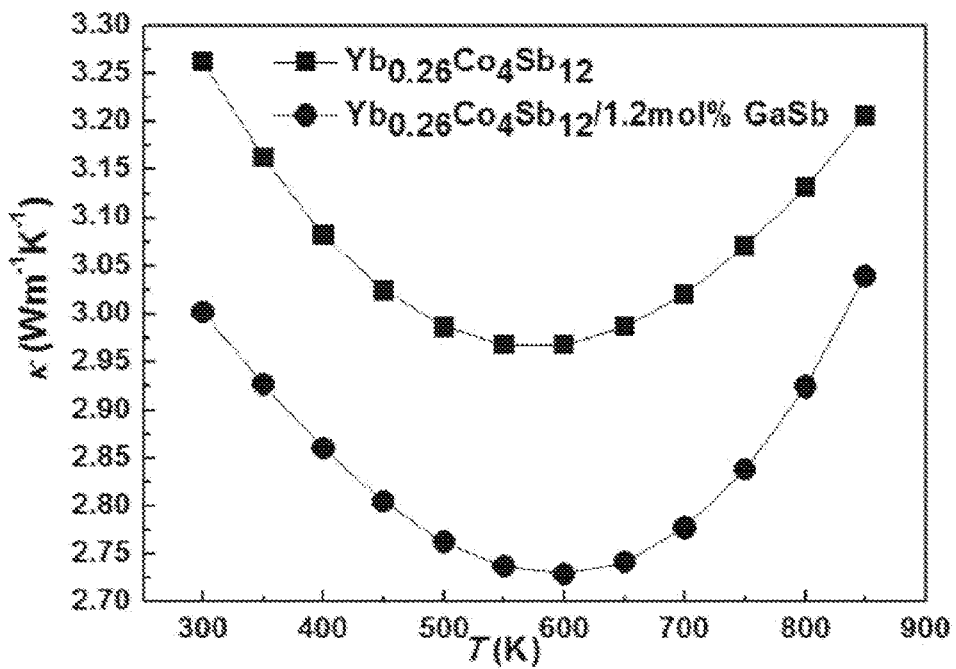
FIG. 9 shows the overall thermal conductivity of $Yb_{0.26}Co_4Sb_{12}/1.2$ mol % GaSb thermoelectric composite material prepared according to Example 1 as a function of temperature, wherein the overall thermal conductivity of the composite material, represented by κ in the figure, is decreased due to the decrease of electronic thermal conductivity.
Figure 10:
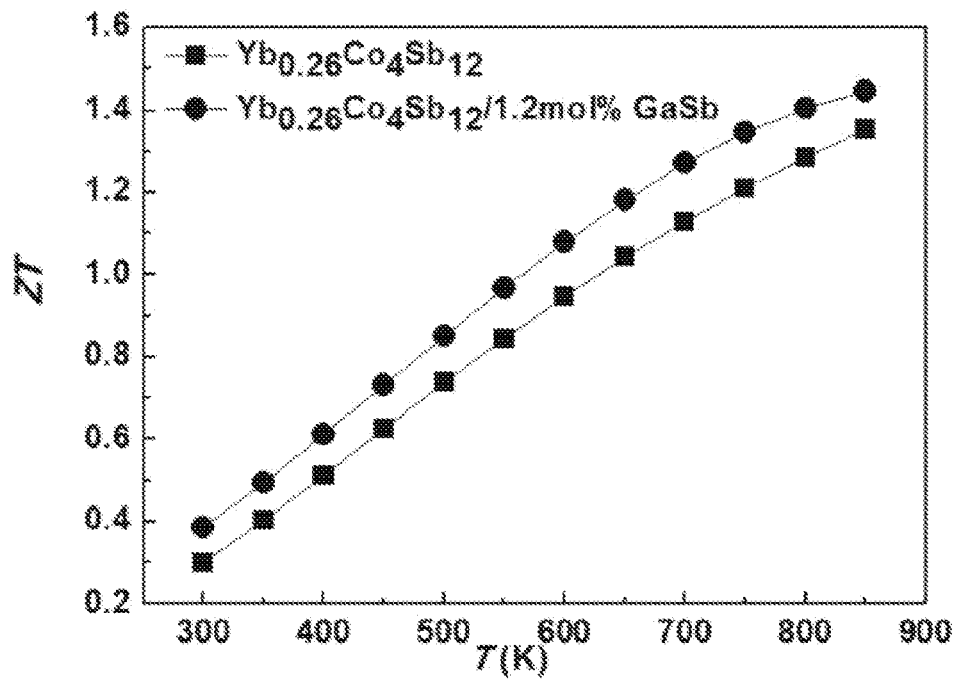
FIG. 10 shows the ZT value of $Yb_{0.26}Co_4Sb_{12}/1.2$ mol % GaSb thermoelectric composite material prepared according to Example 1 as a function of temperature, wherein the ZT value of the material is increased substantially in the whole temperature zone due to the introduction of GaSb nanoparticles.

Disclosed is a thermoelectric conversion material having excellent properties that is derived by modifying the preparation process to use an in-situ compounding method and take advantage of the co-crystallization of GaSb and Sb which are totally immiscible according to Ga—Sb phase map (see FIG. 2).

A thermoelectric conversion material having excellent properties and increased η value is obtained by using an in-situ compounding method and taking advantage of the co-crystallization of GaSb and Sb which are totally immiscible according to Ga—Sb phase map (see FIG. 2). In an embodiment, a thermoelectric composite material is obtained, wherein a second phase of GaSb, which is 2-50 nm, preferably 5-30 nm in size, is readily generated in the matrix during cooling after the matrix is molten at high temperature. A thermoelectric conversion material having excellent properties can also be obtained by spark plasma sintering (SPS) or hot-pressed sintering. The composite material is characterized by that GaSb nanoparticles therein (particularly GaSb nanoparticles generated in-situ and having a size of 5-30 nm) and can scatter phonons and low-energy electrons at the same time so as to enhance the thermoelectric property of the material in the whole temperature zone.

As used herein, "compounding materials" are generally weighted stoichiometrically, for example, using any conventional process known in the art.

As used herein, "packaging" generally refers to vacuum sealing of a metal material as desired. For example, an active metal material may be vacuum sealed in a device such as a quartz glass tube using any conventional process known in the art to guarantee a vacuum environment without moisture and oxygen for the material, so that the material will react with nothing more than itself in subsequent melting and annealing.

As used herein, "melting" refers to heating the starting material to a temperature higher than the lowest comelting point of its components. Specifically, the melting temperature may be 1000-1200° C. Generally, the elements form a liquid mixed phase with high homogeneity after the starting material is heated to a temperature higher than the lowest comelting point of its components.

As used herein, "quenching" generally refers to a quenching process in a quenching medium selected from air, water, saturated salt water, oil or liquid nitrogen, or without any quenching medium. The cooling rate of quenching may be 50° C.-$10^{6\circ}$ C./s. The specific quenching process comprises melt spinning and the like. However, there is no specific limitation on the quenching process as long as it can cool the high-temperature melt to a low temperature rapidly and keep the elements of the low-temperature solid distributed homogeneously in a state as close to that at high temperature as possible. Specifically, the quenching process of the invention comprises various processes known in the art, which may cool the high-temperature species to room temperature or even lower at a relatively high cooling rate in an unconventional cooling way other than furnace cooling.

As used herein, "annealing" involves, but is not limited to, an annealing temperature of 400-850 C and an annealing time of 1-300 hours. There is no specific limitation on the annealing process as long as it can hold the temperature of the block for a long time after the block has been heated to that temperature, and then allow it to cool slowly to room temperature. According to embodiments, a solid phase reaction occurs in the annealing process wherein a nanoscale composite material is formed.

As used herein, "consolidating" or "sintering" comprises pressure sintering. Specifically, "pressure sintering" comprises spark plasma sintering (SPS) and hot-pressed sintering. In an example pressure sintering process, the sintering temperature is 500-650° C., the hold time is 5-120 minutes and pressure is 10-100 MPa.

As used herein, "spark plasma sintering" (SPS) is a conventional pressure sintering process in the art, wherein the temperature can be raised rapidly and held for a short time. Specifically, the heating rate is generally 50-100° C./min, and the hold time is 3-15 minutes.

As used herein, "hot-pressed sintering" is a conventional pressure sintering process in the art, wherein the temperature can be raised slowly and held for a long time. Specifically, the heating rate is generally 5-15° C./min, and the hold time is 30-120 minutes.

Various embodiments will be detailed in the following description.

Filled Skutterudite Matrix

The filled skutterudite matrix of the invention is shown as formula (I):

$$I_yCo_4Sb_{12} \quad (I)$$

wherein

I represents at least one of Yb, Eu, Ce, La, Nd, Ba and Sr, 0.05≤y<1, preferably 0.1≤y<0.5.

In embodiments, I is Yb, or I is Ce, Ba or a combination thereof.

In an embodiment, n-type filled skutterudite, as the matrix of the disclosed composite material, has an energy band structure with the following features:

(1) It is a heavily doped semiconductor, the Fermi level of which enters the conduction band;

(2) The location of the Fermi level in the condition band changes as the amount and the valence state of the filled atoms change.

The features of the energy band structure of the n-type filled skutterudite matrix determine that electrons are the absolutely dominant carriers in the whole composite material. If some p-type semiconductor nanoparticles are dispersed in the n-type filled skutterudite matrix, the electronic transmission state of the matrix will be changed. Since the Fermi level of a p-type semiconductor is close to its conduction band bottom, the conduction band bottom of the p-type semiconductor is close to the Fermi level of the filled skutterudite when their vacuum energy levels are taken as the reference frame, so that a potential barrier is to form after a balanced electronic energy band structure develops at the interface between the two materials, wherein the height of the potential barrier is equivalent to the forbidden band width of the p-type semiconductor. Electrons in the filled skutterudite matrix have to cross the potential barrier during transmission before they can be transported from the conduction band of the filled skutterudite to the conduction band of the p-type semiconductor. Therefore, electrons of low energy are filtered off. Since the high-energy electrons that cross the potential barrier contribute more to the Seebeck coefficient, the Seebeck coefficient of the composite material is substantially increased.

GaSb Particles

The composite material comprises 0.05-5 mol %, preferably 0.1-2.0 mol %, more preferably 1.0-2.0 mol % GaSb particles.

The GaSb particles can be GaSb nanoparticles.

The average grain size of the GaSb particles can be in the range of 2-50 nm, e.g., 5 nm-30 nm.

The GaSb particles can be distributed intragranularly in the crystalline granules of the filled skutterudite matrix, or intergranularly on the crystalline boundaries of the filled skutterudite matrix, or both.

In an embodiment, the GaSb nanoparticles in the material are precipitated in-situ in the filled skutterudite matrix to form the second phase of GaSb nanoparticles.

According to the disclosure, the p-type semiconductor dispersed in the filled skutterudite matrix of the composite material is composed of GaSb particles, wherein GaSb is a p-type semiconductor having a forbidden band width of about 0.7 eV. A potential barrier having a height of about 0.7 eV may be formed at the interface between GaSb and the filled skutterudite. Thus, the low-energy electrons in the filled skutterudite matrix are filtered off by the potential barrier during transmission, and the thermoelectric property of the material is therefore improved substantially.

The GaSb particles include, but are not limited to, any GaSb solid solution prepared or formed by any process for the purpose of modification.

Composite Material and Preparing Process Thereof

The process for preparing the composite material comprises weighing stoichiometrically and packaging I, Co, Sb and Ga, wherein I is at least one selected from Yb, Eu, Ce, La, Nd, Ba and Sr, forming a molten mixture of I, Co, Sb and Ga, wherein I is at least one selected from Yb, Eu, Ce, La, Nd, Ba and Sr, quenching the molten mixture to form a solid bulk material, annealing the solid bulk material to obtain an annealed solid bulk material, forming the annealed solid bulk material into powder, and consolidating the power to form the composite material.

The molten mixture can have a melting temperature of 1000-1200° C.

A quenching medium can be selected from air, water, salt water, oil or liquid nitrogen is used for quenching. Alternatively, other quenching processes are used, including melt spinning technique, etc.

An annealing temperature of 400-850° C. can be used for annealing.

In an embodiment, the annealed solid bulk material is ground into powder.

In a further embodiment, the powder is sintered by pressure sintering to form the composite material. For example, the powder can be sintered by hot-pressed sintering technique or spark plasma sintering to form the composite material.

Before molten, the mixture of I, Co, Sb and Ga may be generally compounded and packaged in a conventional way known in the art.

In an example compounding step, highly pure metals in the form of single substance or compounds of these metals are weighted stoichiometrically in a glove box filled with inert atmosphere which is comprised of highly pure argon with strictly controlled contents of oxygen and moisture, namely $O_2$<0.1 ppm, $H_2O$<5 ppm.

In the packaging step, the weighted starting material is placed in a quartz tube with a high-temperature inert layer located therein, and packaged using argon plasma flame after the glove box, into which the material has been loaded, is vacuumed. The high-temperature inert layer is selected from one of a carbon film layer, a graphite crucible or a tantalum crucible to prevent the reaction between the starting material and the quartz tube. During packaging, the gas pressure in the quartz tube is controlled in the range of 0.1-40000 Pa as desired by subsequent annealing reactions.

The packaged quartz tube is slowly heated to 1000-1200° C. at a rate of 0.5-3° C./min in a melting furnace. The starting material is then held in a molten state for 1-48 hours to achieve full and even mixing. Subsequently, the quartz tube is quenched in a quenching medium selected from one of air, water, saturated salt water, oil or liquid nitrogen.

The quenched quartz tube can be annealed in a furnace at 400-850° C. for 1-300 hours.

The block obtained after annealing can be ground into powder and then pressure sintered by hot-pressed sintering or spark plasma sintering at 500-650° C. and 10-100 MPa for 5-120 minutes.

In the filled skutterudite thermoelectric matrix, the second nanophase of GaSb generated in-situ is distributed in the form of crystalline granules of 5-30 nm in size, or distributed intragranularly in the crystalline granules of the filled skutterudite matrix, or intergranularly on the crystalline boundaries of the filled skutterudite matrix, or both.

Technical Effects

The thermoelectric composite material exhibits a substantially increased Seebeck coefficient, a decreased overall thermal conductivity, and therefore a substantially increased ZT value, which may be increased by up to 10-30%, in the whole temperature zone.

In comparison with a matrix material without GaSb nanoparticles, the theoretical thermoelectric conversion efficiency of the thermoelectric composite material may be increased from 14.8% to 16.1%.

In an embodiment, the particle size may be controlled in the range of 5-30 nm.

In an embodiment, it may be ensured that no impurities are to be generated in the preparation.

The invention will be explained in further detail with reference to the following specific examples. It is to be understood that these examples are provided only for the purpose of illustrating the invention without limiting the scope thereof. Generally, in the following examples, conventional conditions, for example those described in a process manual, or conditions suggested by manufacturers, will be followed where no specific conditions are given for an experiment. Unless otherwise specified, all ratios and percentages are based on molar proportions (or atomic proportions).

Unless otherwise defined or specified, all special and scientific terms used herein have the meanings known by those skilled in the art. In addition, any process or material similar or equivalent to those cited herein may be used in the invention.

The method for measuring thermoelectric property may be carried out according to the following: G. S. Nolas, J. Sharp, H. J. Goldsmid, Springer, 2001" (Thermoelectrics: Basic Principles and New Materials Developments, G. S. Nolas, J. Sharp, H. J. Goldsmid, Springer, 2001).

EXAMPLE 1

In a glove box, highly pure Yb, Co, Sb, Ga blocks were compounded in molar ratios of 0.26:4:12:0 and 0.26:4:12.2:0.2 respectively. Each of the starting materials was sealed in a quartz tube, the inner wall of which was vapor deposited with a carbon film, and packaged using argon plasma flame while the box was vacuumed. The packaged quartz tubes were heated to 1100° C. at a heating rate of 2° C./min, and then held at this temperature for 20 hours. Subsequently, the tubes were quenched in saturated salt water. The quenched crystal bars were annealed at 730° C. for 240 hours together with the quartz tubes, resulting in blocks comprised of $Yb_{0.26}Co_4Sb_{12}$ and $Yb_{0.26}Co_4Sb_{12}$/1.2 mol % GaSb respectively. After ground into powder, the blocks were spark plasma sintered at 600° C. and 50 MPa for 5 minutes. The phase analysis, microstructures and thermoelectric properties of the resultant materials were shown in FIGS. 4-9.

EXAMPLE 2

In a glove box, highly pure Yb, Co, Sb, Ga blocks were compounded in a molar ratio of 0.26:4:12.3:0.3. The starting material was sealed in a quartz tube within which a tantalum foil crucible was disposed, and packaged using argon plasma flame while the box was vacuumed. The packaged quartz tube was heated to 1200° C. at a heating rate of 3° C./min, and then held at this temperature for 10 hours. Subsequently, the tube was quenched in saturated salt water. The quenched crystal bar was annealed at 750° C. for 300 hours together with the quartz tube, resulting in a block comprised of $Yb_{0.26}Co_4Sb_{12}$/1.8 mol % GaSb. After ground into powder, the block was spark plasma sintered at 600° C. and 60 MPa for 10 minutes. The maximum ZT value of the resultant thermoelectric composite material was 1.35 (850K).

EXAMPLE 3

In a glove box, highly pure Ce, Ba, Co, Sb blocks and GaSb powder were compounded in a molar ratio of 0.08:0.12:4:12:0.05. The starting material was sealed in a quartz tube within which a graphite crucible was disposed, and packaged using argon plasma flame while the box was vacuumed. The packaged quartz tube was heated to 1150° C. at a heating rate of 0.5° C./min, and then held at this temperature for 48 hours. Subsequently, the tube was quenched in an oil bath. The quenched crystal bar was annealed at 760° C. for 200 hours together with the quartz tube, resulting in a block comprised of $Ce_{0.08}Ba_{0.12}Co_4Sb_{12}$/0.3 mol % GaSb. After ground into powder, the block was hot-pressed sintered at 580° C. and 30 MPa for 30 minutes. The maximum ZT value of the resultant thermoelectric composite material was 1.41 (800K).

All references mentioned in this disclosure are incorporated herein by reference, as if each of them would be incorporated herein by reference independently. In addition, it is to be appreciated that various changes or modifications can be made to the invention by those skilled in the art who have read the content taught above. These equivalents are intended to be included in the scope defined by the appended claims of the application.

The invention claimed is:

1. A composite material comprising:
   a filled skutterudite matrix of formula (I)

$$I_yCo_4Sb_{12} \quad (I)$$

wherein
   I represents at least one of Yb, Eu, Ce, La, Nd, Ba and Sr, 0.05≥y<1; and
   GaSb particles disposed within said filled skutterudite matrix, wherein said composite material comprises 0.05-5 mol % GaSb particles.

2. The material of claim 1, wherein 0.1≥y<0.5.

3. The material of claim 1, wherein said GaSb particles are nanoparticles.

4. The material of claim 1 or 2, wherein said GaSb particles are nanoparticles with an average grain size of between about 2 nm-50 nm.

5. The material of claim 1 or 2, wherein said GaSb particles are nanoparticles with an average grain size of between about 5 nm-30 nm.

6. The material of claim 1, wherein said GaSb particles are distributed intragranularly in the crystalline granules of said filled skutterudite matrix, or intergranular on the crystalline boundaries of said filled skutterudite matrix, or both.

7. The material of claim 1, wherein I is Yb.

8. The material of claim 1, wherein I is Ce, Ba or a combination thereof.

9. The material of claim 1, wherein said composite material includes between about 0.1-2.0 mol % GaSb particles.

10. The material of claim 1, wherein said composite material includes between about 1.0-2.0 mol % GaSb particles.

11. A process for preparing the composite material of claim 1, comprising:
    providing a molten mixture of I, Co, Sb and Ga, wherein I represents at least one of Yb, Eu, Ce, La, Nd, Ba and Sr, quenching said molten mixture to form a solid bulk material;
    annealing said solid bulk material to provide an annealed solid bulk material;
    forming said annealed solid bulk material into powder; and
    sintering said powder to form said composite material.

12. The process of claim 11, wherein said molten mixture is molten and mixed at a melting temperature of 1000-1200° C.

13. The process of claim 11, wherein, quenching said molten mixture with a quenching medium selected from air, water, salt water, oil or liquid nitrogen.

14. The process of claim 11, wherein, quenching said molten mixture by melt spinning method at a cooling rate of 50° C.-$10^6$° C./s.

15. The process of claim 11, wherein, annealing said solid bulk material at an annealing temperature of 400-850° C.

16. The process of claim 11, wherein, forming said annealed solid bulk material into powder by grinding.

17. The process of claim 11, wherein said powder is sintered by employing at least one of hot pressed sintering or spark plasma sintering to form said composite material.

* * * * *